United States Patent [19]
Jiang

[11] Patent Number: 6,110,219
[45] Date of Patent: *Aug. 29, 2000

[54] MODEL FOR TAKING INTO ACCOUNT GATE RESISTANCE INDUCED PROPAGATION DELAY

[75] Inventor: Chun Jiang, San Jose, Calif.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/899,579

[22] Filed: Jul. 24, 1997

Related U.S. Application Data

[60] Provisional application No. 60/041,753, Mar. 28, 1997.

[51] Int. Cl.[7] ..................................................... G06F 17/50
[52] U.S. Cl. ................................. 716/1; 703/19; 703/13; 703/14; 703/15
[58] Field of Search ................................. 395/500, 500.02, 395/500.07, 500.4, 500.34, 500.35, 500.36; 364/578, 488–491; 716/1, 6; 703/19, 13, 14, 15

[56] References Cited

U.S. PATENT DOCUMENTS

| | | | |
|---|---|---|---|
| 4,959,565 | 9/1990 | Knetch et al. | 327/310 |
| 5,461,579 | 10/1995 | Misheloff et al. | 716/5 |
| 5,553,008 | 9/1996 | Huang et al. | 703/14 |
| 5,636,130 | 6/1997 | Salem et al. | 716/6 |
| 5,694,052 | 12/1997 | Sawai et al. | 324/769 |

OTHER PUBLICATIONS

Deschacht, Denis et al. Delay Propagation Effect in Transistor Gates, *IEEE Journal of Solid–State Circuits*, vol. 31, No. 8, Aug. 1996, pp. 1184–1189.

Fujii, Kunihiro et al., Sub–Quarter Micron Titanium Salicide Technology with In–Situ Silicidation Using High–Temperature Sputtering, Symposium of VLSI Technology Digest of Technical Papers, 1995, pp. 57–58.

Sakurai, Takayasu, Closed–Form Expressions for Interconnections Delay, Coupling, and Crosstalk in VLSI's, *IEEE Transactions of Electron Devices*, vol. 40, No. 1, Jan. 1993, pp. 118–124.

Takagi, M.T. et al, *A Novel 0.15 μm CMOS Technology using W/WNx/Polysilicon Gate Electrode and Ti Silicided Source/Drain Diffusions*, IEDM 1996, pp. 455–458.

*Primary Examiner*—Paul R. Lintz
*Assistant Examiner*—Vuthe Siek
*Attorney, Agent, or Firm*—Fliesler, Dubb, Meyer & Lovejoy LLP

[57] ABSTRACT

When simulating a circuit's behavior, a transistor can be modeled to account for gate resistance induced propagation delay. In one embodiment, the model includes a transistor with a resistor connected to the gate of the transistor. The resistor has a resistance equal to one third of the gate resistance.

40 Claims, 4 Drawing Sheets

MODEL FOR TAKING INTO ACCOUNT GATE RESISTANCE INDUCED PROPAGATION DELAY

PRIORITY DATA

This application claims the benefit of U.S. Provisional application Ser. No. 60/041,753, filed Mar. 28, 1997.

BACKGROUND OF THE INVENTION

1. Field of the Invention

The present invention is directed to a model of a transistor that can be used to account for gate resistance and/or gate resistance induced propagation delay.

2. Description of the Related Art

Transistors suffer from a switching delay due to the resistance of the gate. This delay is called gate resistance induced propagation delay (GRID). Standard performance modeling or simulating of transistors has typically ignored GRID because other delays have been of such magnitude that GRID was insignificant. However, as device dimensions are scaled down (e.g. sub-half micron CMOS technology) GRID has become a more significant percentage of a transistor's total switching delay.

When simulating a circuit that includes transistors, an RC lumped model is conventionally used to account for distributive RC line delays. However, the RC lumped models is not a practical means for simulating GRID because it does not account for the width effect of the transistor and it unreasonably slows down the simulation.

Therefore, an efficient model of a transistor is needed that can be used to account for gate resistance induced propagation delay.

SUMMARY OF THE INVENTION

The present invention provides for a model of a transistor that takes in to account gate resistance induced propagation delay. The model, roughly described, includes a transistor and a resistance element. The transistor includes a source, a drain and a gate. The resistance element is a device that provides a resistance. The resistance element is connected to the gate and has a resistance equal to one third of the gate resistance. In one embodiment, the resistance element is a resistor. Alternatives include connecting a second resistance element to the gate. The second resistance element has a resistance equal to two thirds of the gate resistance.

The model of the transistor is used to simulate the performance of a circuit containing the transistor. In one implementation, the model of the transistor is represented as code on a storage medium for input to a circuit simulator running on a computer. The circuit simulator uses the code for the model, in addition to code that describes the circuit, in order to simulate the circuit.

These and other objects and advantages of the invention will appear more clearly from the following detailed description in which the preferred embodiment of the invention has been set forth in conjunction with the drawings.

DETAILED DESCRIPTION

Figure 1A:
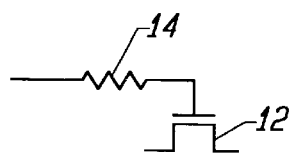
FIG. 1A is a schematic of an empirical model of a transistor with one resistor.

FIG. 1A shows an empirical model used to simulate the behavior of a transistor. The model includes a transistor 12 and a resistor 14 connected to the gate of transistor 12. Resistor 14 has a resistance equal to one third ($\frac{1}{3}$) of the poly gate resistance of transistor 12. Transistor 12 can be an n-type transistor or a p-type transistor.

Figure 1B:
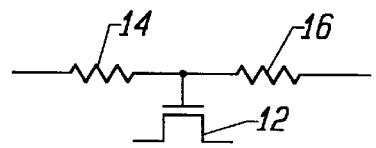
FIG. 1B is a schematic of an empirical model of a transistor with two resistors.

FIG. 1B shows the empirical model of FIG. 1A with a second resistor 16 connected to the gate of transistor 12. Note that in the preferred embodiment, transistor 12 is a CMOS transistor; however, other technologies may also be suitable for use with the present invention. Resistor 16 has a resistance equal to two thirds ($\frac{2}{3}$) of the total poly gate resistance for transistor 12. In many cases, the model of FIG. 1A will be suitable. However, in circuits where the poly gates of two transistors are connected in series, the model of FIG. 1B with additional resistor 16 is used to model the total poly gate resistance. By using the models of FIG. 1A or 1B, a simulation of a circuit using transistors can properly model the poly gate resistance and the delay induced by that resistance.

Figure 2:
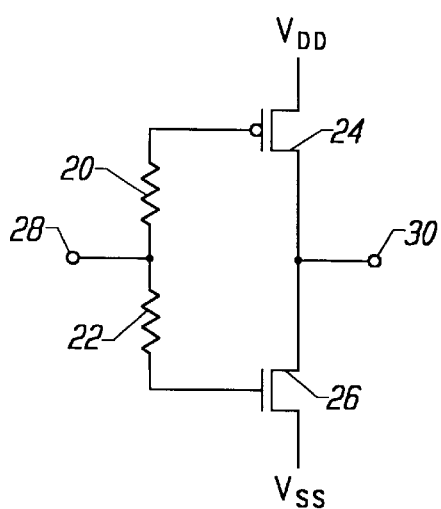
FIG. 2 is a schematic of an inverter using the model of FIG. 1A.

FIG. 2 is a schematic of an inverter utilizing the model of FIG. 1A. The input to the inverter is at node 28 and the output of the inverter is at node 30. Resistor 20 has one end connected to node 28 and a second end connected to the gate of p-type transistor 24. The source of transistor 24 is connected to Vdd which can typically be 5 volts or the equivalent to logic one. The drain of transistor 24 is connected to node 30. One end of resistor 22 is connected to node 28 and the other end of resistor 22 is connected to the gate of n-type transistor 26. The source of n-type transistor 26 is connected to Vss which can be ground or the equivalent of logic zero. The drain of transistor 26 is connected to node 30. The resistance of resistor 20 is equal to one third ($\frac{1}{3}$) of the total poly gate resistance of resistor 24. The resistance of transistor 22 is equal to one third ($\frac{1}{3}$) of the total poly gate resistance of transistor 26.

Figure 3:
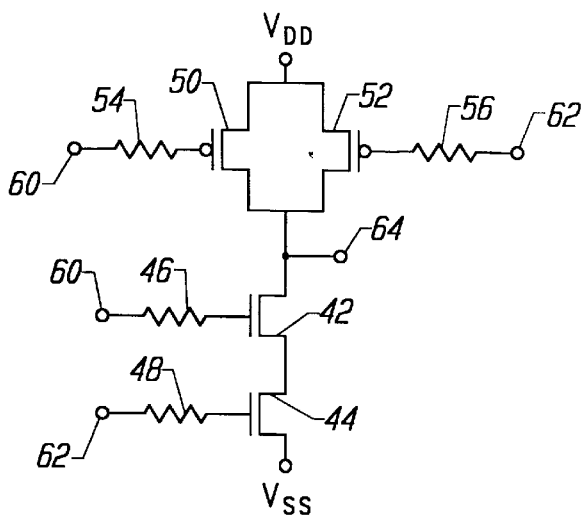
FIG. 3 is a schematic of a NAND gate using the model of FIG. 1A.

FIG. 3 is schematic of a NAND gate using the model of FIG. 1A. The NAND gate has two inputs: 60 and 62. The output of the NAND gate is at node 64. Resistor 46 has one end connected to node 60 and a second end connected to the gate of n-type transistor 42. Resistor 48 has one end connected to node 62 and the other end connected to the gate of n-type transistor 44. The source of transistor 44 is connected to VSS and the drain of transistor 44 is connected to the source of transistor 42. The drain of transistor 42 is connected to node 64. Resistor 54 has one end connected to node 60 and a second end connected to the gate of p-type transistor 50. Resistor 56 has one end connected to node 62 and a second end connected to the gate of p-type transistor 52. The source of transistor 52 and the source of transistor 50 are both connected to Vdd. The drain of transistor 50 and the drain of transistor 52 are both connected to node 64. Resistor 54 has a resistance equal to one third (⅓) of the total poly gate resistance for transistor 50. Resistor 56 has a resistance equal to one third (⅓) of the total poly gate resistance for transistor 52. Resistor 46 has a resistance equal to one third (⅓) of the total poly gate resistance of transistor 42. Resistor 48 has a resistance equal to one third (⅓) of the total poly gate resistance for transistor 44.

Figure 4:
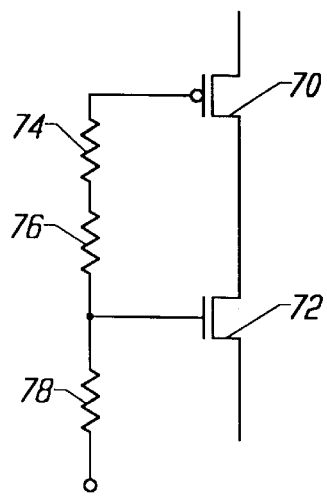
FIG. 4 is a schematic of a circuit using the model of FIG. 1B.

FIG. 4 shows a circuit that utilizes the model of FIG. 1B. The circuit includes p-type transistor 70 and n-type transistor 72. The drain of transistor 70 is connected to the source of transistor 72. One end of resistor 74 is connected to the gate of transistor 70. The other end of resistor 74 is connected to a first end of resistor 76. A second end of resistor 76 is connected to a first end of resistor 78 and the gate of transistor 72. Resistor 78 has a resistance equal to one third (⅓) of the total poly gate resistance of transistor 72. Resistor 76 has a resistance equal to two thirds (⅔) of the poly gate resistance of transistor 72. Resistor 74 has a resistance equal to one third (⅓) of the total poly gate resistance of transistor 70. The resistance values for approximating GRID may be approximate. For example, resistance values of approximately ⅓ and ⅔ of the polygate resistance may be utilized and be in accordance with the present invention.

Alternatives to the empirical models of FIGS. 1A and 1B include RC lumped models. That is, the transistor can be broken up into a number of transistors, each one called a segment. Each transistor would have a resistor connected to its gate. The magnitude of the resistor connected to each transistor would be equal to the total poly gate resistance divided by the number of segments. Another alternative includes connecting two resistors to each gate for each segment. The resistance of those resistors would be equal to one half (½) the total poly gate resistance divided by the number of segments. These two modes are called the L model and T model respectively. Simulation has shown that to reach a level of sufficient accuracy, the L model needs many more segments than the T model. Thus, the L model is less efficient in a simulation environment. Table 1 below lists simulated delay values for various ring oscillators with different gate widths, resistoring capacitors and supply voltages. As can be seen from the data, the maximum difference observed between the T model and the empirical model of FIG. 1A is smaller than 2 percent. Since the empirical model of FIG. 1A is within reasonable accuracy limits of the L model, it is preferable to use the empirical model because it is more efficient due to the smaller amount of circuit elements.

TABLE 1

|  | 1/3 Rg Model | T Model | Difference (%) |
|---|---|---|---|
| Cload (ff) |  |  |  |
| 100 | 67.5 | 67.6 | −0.15 |
| 200 | 84.7 | 84.8 | −0.12 |
| 400 | 117.6 | 117.8 | −0.17 |

TABLE 1-continued

|  | 1/3 Rg Model | T Model | Difference (%) |
|---|---|---|---|
| Vdd (V) |  |  |  |
| 1.3 | 69 | 68.6 | 0.58 |
| 1.8 | 49.3 | 49.25 | 0.1 |
| 2.5 | 41.7 | 42.3 | −1.42 |
| Wp/Wn (μm) |  |  |  |
| 10/5 | 32.2 | 32.2 | 0 |
| 40/20 | 49.3 | 49.25 | 0.1 |

Figure 5:
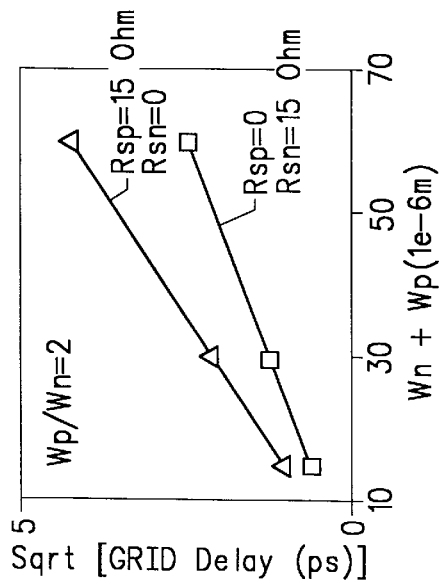
FIG. 5 is a graph of gate resistance induced propagation delay versus gate sheet resistance.

FIG. 5 plots GRID versus the sheet resistance. The squares are measured data of $W_P/W_N=20/10$ μm for Rs=4 Ω with Si implants and Rs=15 Ω without Si implants, where Rs is the sheet resistance. FIG. 5 shows that grid is linearly proportional to gate sheet resistance while the transistor with a larger width has a larger slope of GRID versus sheet resistance.

Figure 6:
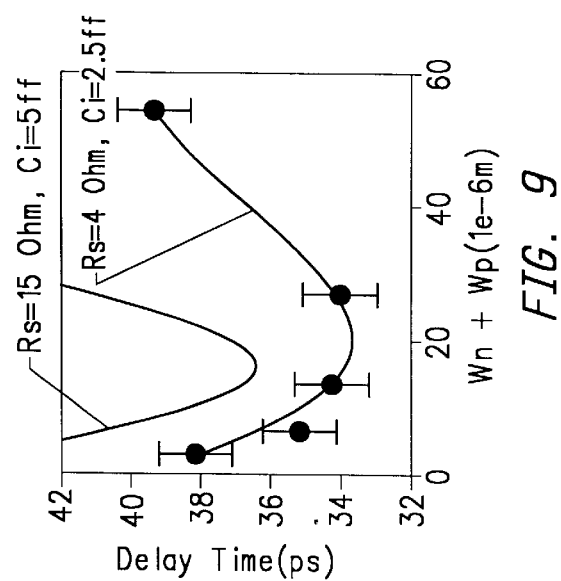
FIG. 6 is a graph of the square root of gate resistance induced propagation delay versus the poly gate width.

FIG. 6 plots the square root of GRID against transistor width. As can be seen, the graph shows that GRID depends on the square of the transistor width; consequently, a larger PMOSFET gate has a larger impact to the delay.

Figure 7:
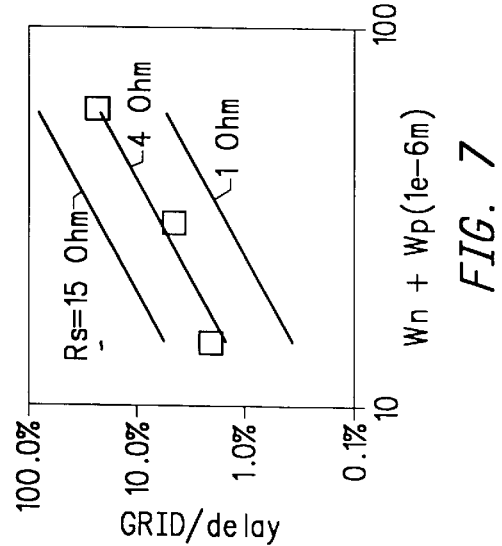
FIG. 7 is a graph that shows the design rule of gate resistance induced propagation delay with respect to poly gate width and gate sheet resistance.

FIG. 7 plots GRID as a percentage of total delay of the transistor (GRID/total delay) versus transistor width. Three lines are shown for three different gate resistances of 1 Ω, 4 Ω and 15 Ω. FIG. 7 assumes 0.25 μm CMOS technology, where the intrinsic delay is 30 ps without considering GRID.

Figure 8:
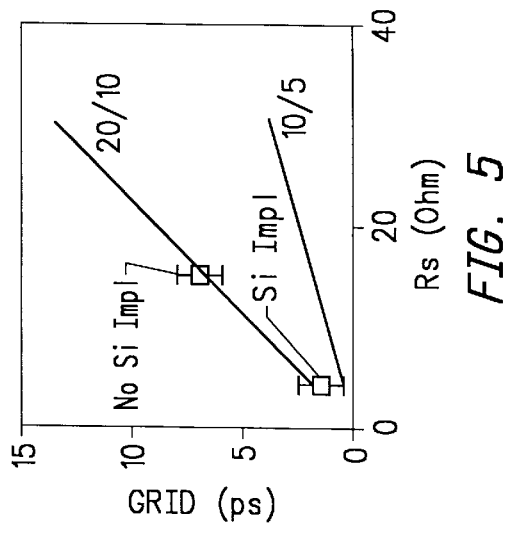
FIG. 8 is a graph showing the percentage of gate resistance induced propagation delay as compared to total delay versus device dimension.

FIG. 8 plots GRID as a percentage of total delay (GRID/total delay) versus minimum feature technology. Assuming that CMOS technology migrates with a scaling factor S (e.g. a value of 0.7) and the poly gate sheet resistance is kept the same (5 Ohms) for different technologies, it is found that (GRID/total delay) increases with ($1/S^2$) for constant transistor width and keeps the same value for the scaling down transistor width of different technologies as shown in FIG. 8. The value (GRID/total delay) increases from 1.6 percent for 0.5 μm CMOS technology to 18 percent of 0.18 μm CMOS technology for the same transistor width of $W_P/W_N=20/10$ μm, while the value has little change for those with the scaling down transistor widths.

The above analysis indicates that grid can be reduced by decreasing the transistor width or using multiple finger gate structures. However, in the case of the narrower transistor width, the delay is more affected by the parasitic interconnect capacitance. Therefore, to achieve the best performance, the transistor width needs to be optimized to minimize GRID and interconnect capacitance.

Figure 9:
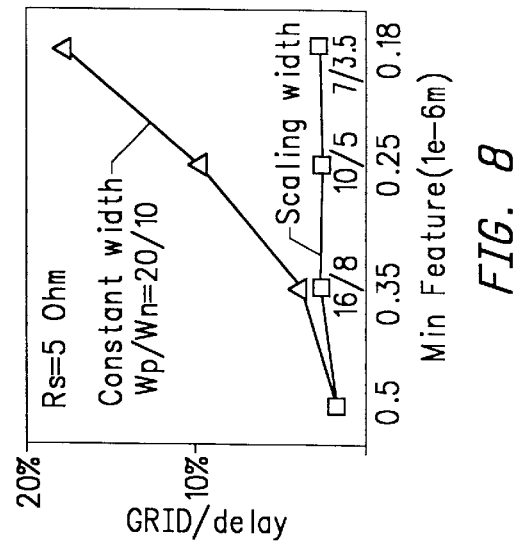
FIG. 9 is a graph showing delay versus transistor width.

FIG. 9 shows measured delay data plotted against transistor width. The measured delay data with Rs=4 Ω and Ci=2.5 ff match well with the simulation curve for transistor widths ranging from 3.75 μm to 60 μm. The value of Ci=2.5 ff is extracted from Raphael simulation. The optimized total transistor width is around 22 μm for Rs=5 Ω, Ci=5 ff and 17 μm for Rs=15 Ω and Ci=5 ff for 0.25 μm CMOS technology.

Figure 10:
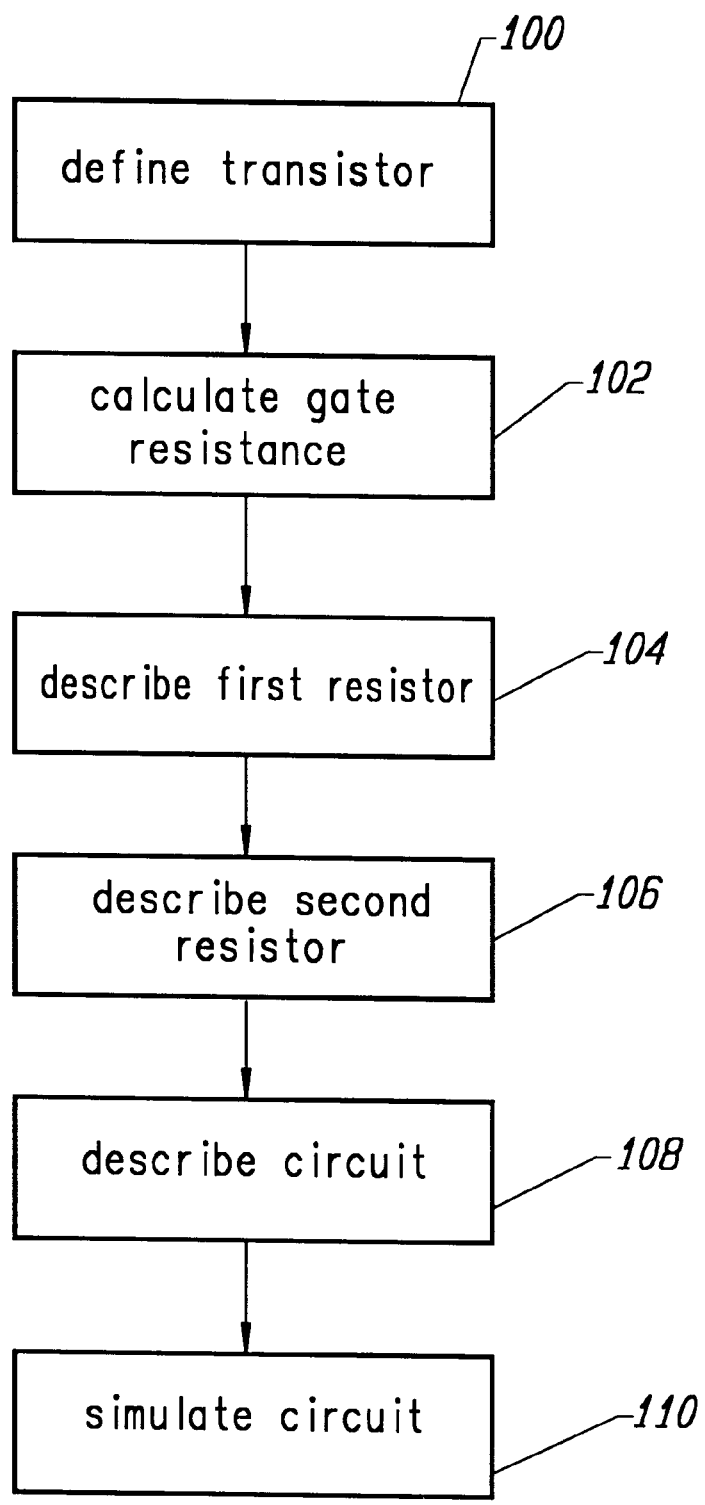
FIG. 10 is a flow chart describing the steps for creating and using the model of FIG. 1.

FIG. 10 is a flow chart describing the steps for creating and using the model of FIG. 1. The steps of FIG. 10 are part of the design process of a circuit. Typically a circuit will first be designed or proposed. At that point, or another suitable time, the steps of FIG. 10 will be performed. In step 100 the transistor is defined. Defining the transistor includes specifying the nature of the transistor and/or the values of parameters described in the transistor. Parameters can include the length of the transistor, the width of the transistor, transconductors coefficients, 0-bias threshold voltage, channel length modulation, body-effect parameters, surface potential, drain ohmic resistance, source ohmic resistance and other parameters that describe a transistor. Step 100 can be performed as part of the circuit design process, the fabrication process or the simulation process.

In step 102, the poly gate resistance is calculated. The resistance of a uniform slab of conducting material may be expressed as:

$$R = \left(\frac{p}{t}\right)\left(\frac{1}{w}\right) \quad \text{(ohms)}$$

where
   p=resistivity
   t=thickness
   l=conductor length
   w=conductor width.
This expression may be rewritten as $$R = R_S\left(\frac{l}{w}\right) \quad \text{(ohms)}$$

where $R_S$ is the sheet resistance having units of ohm/square. Thus, to obtain the resistance of a poly gate having a generally rectangular shape, one would simply multiply the sheet resistance by the ratio of the length to the width of the poly. Typically, in 0.25 $\mu$m CMOS technology, $R_S$ ranges from 3 to 10 ohm/square, width can be from 2–40 $\mu$m and length can be approximately 0.25 $\mu$m. The step of calculating gate resistance can be performed either by computer or manually.

In step 104, the resistor used in the model of the transistor is described. The resistor being referred to is resistor 14 of FIG. 1A. A file is created and/or code is written in suitable format for a simulator that describes the resistor, including the resistance of the resistor. The resistance of the resistor is equal to one third (⅓) of the gate resistance calculated in step 102. Step 106, which is optional, is used when the model of FIG. 1B is being used. In step 106, the second resistor 16 is described. In step 108, the circuit is described in a format suitable for a simulator. Steps 104 through 108 could include creating a net list, simulator input file or code for a simulator input file. In step 110, the code created in steps 104, 106, 108 are used with a simulator to simulate the circuit. One example of a suitable simulator is SPICE including HSPICE, PSPICE or other suitable products. Additional simulators, other than SPICE, are also suitable for use with the present invention. Table 2 below is an example of code to be used with HSPICE which is created as a result of steps 100 through 108.

TABLE 2

```
* RO with gate resistance model
.inc cs44e.typ.revs2m
.options co = 80 cptime = 2000 ingold = 2 aspec dv = 1000 list = 1
.options list = 1
.temp 25
.param ll = 0.25 ww = 5.0 pr = 83.33 nr = 125.0
.global vdd gnd
.subckt inv in out
rp in gp pr
rn in gn nr
mp out gp vdd vdd tp w = '2*ww' l = ll
mn out gn gnd gnd tn w = 22    l = ll
.ends inv
```

TABLE 2-continued

```
xi01 01 02 inv
xi02 02 03 inv
xi03 03 04 inv
xi04 04 05 inv
xi05 05 01 inv
*
.dcvolt 01 = 0v
vcc vdd gnd 1.8 dc
.tran 10ps 3ns start = 1ns
.plot tran v(01) v(02) (–0.1, 1.9)
.end
```

The first line of code in Table 2 starts with an "*" and is a comment line. The second line of Table 2 starts with the command ".inc" and instructs the simulator to include another file into this file. The file being included is a file that contains a generic definition of a MOSFET. The third and fourth lines which start with the command ".options" specify various simulator options. The fifth line specifies an operating temperature. The sixth line, which starts off with the pneumonic "param" sets up the values of various parameters to be used in the code. The seventh line identifies two global variables vdd and gnd. The eighth line specifies that the next group of lines of code (8–13) define a circuit element. The circuit element is labeled "inv" and has two terminals which are labeled "in" and "out." In the ninth line of code of Table 2, a resistor is being defined which has a name "rp" and two terminals "in" and "gp," with a resistance equal to pr. Note that in the sixth line the parameter pr was set to 83.33. In line 10, another resistor is defined with a name "rn" having one end connected to the node "in" and another end connected to the node "gn," with a resistance equal to the parameter nr. The parameter nr was defined in line 6 as being equal to 125. In the eleventh line, a p-type transistor "mp" is defined as having its drain tied to the node "out," its gate tied to the node "gp," its source connected to the node "vdd," the substrate tied to "vdd." The transistor "mp" is defined using the model tp (which is defined in the file cs44e.typ.revs2m) and has a channel width equal to 10. In the twelfth line an n-type transistor "mn" is defined having its drain connected to the node "out," its gate connected to the node "gn," its source connected to the node "gnd," its substrate connected to the node "gnd," and a channel width equal to 5. The thirteenth line notes the end of the definition of the "inv" circuit element. As can be seen, the resistor rp is connected to the gate of p-type transistor mp and the resistor rn is connected to the gate of n-type transistor mn. Thus, the resistor rp is the resistor used to model the gate resistance for the transistor mp and the resistor rn as the resistor used to model the resistance for the transistor mn. It is assumed that prior to creating the code of Table 2, the gate resistance was calculated in step 102 to be 250 Ω for mp and 375 Ω for mn; therefore, rp has a resistance of 83.33 Ω (⅓ of 250) and rn has a resistance of 125 Ω (⅓ of 375). The subcircuit "inv" is an inverter similar to that shown in FIG. 2 with the node "in" corresponding to node 28 in FIG. 2 and the node "out" corresponding to node 30.

Line 14 of the code of Table 2 defines a device called "xi01" which is an inverter "inv" having an input connected to node 1 and an output connected to node 2. Line 15 defines another inverter labeled xi02 with an input at node 2 and an output at node 3. Line 16 defines a third inverter xi03 having an input at node 3 and an output at node 4. Line 17 defines a fourth inverter xi04 having input at node 4 and a output at node 5. Line 18 defines a fifth inverter xi05 having input at node 5 and output at node 1. Line 19 is a blank comment line. Line 20 specifies the initial condition of the circuit as having 0 dc volts. Line 21 specifies that the global variable vdd has a potential of 1.8 dc voltage compared to gnd. Line 22 instructs that the simulation will measure data every 10 ps starting at 1 ns and ending at 3 ns. In line 23, the simulator is instructed to plot certain data.

Figure 11:
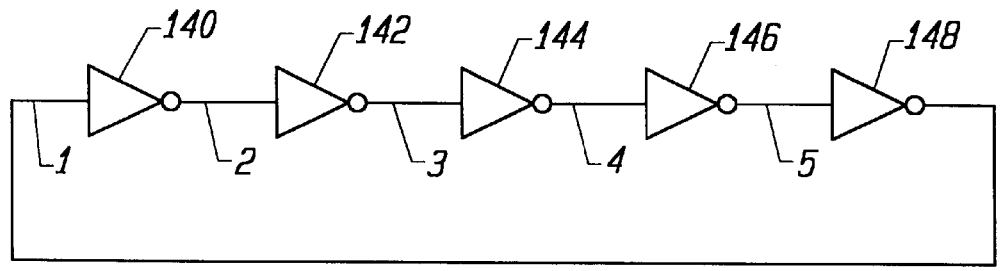
FIG. 11 is a schematic of a ring oscillator.

Based on the description in Table 2 the circuit includes 5 inverters, all of which utilize the model of FIG. 1A. FIG. 11 is a schematic drawing of the circuit defined by the code of Table 2. Node numbers 1–5 are noted on FIG. 11. Inverter 140 corresponds to xi01. Inverter 142 corresponds to xi02. Inverter 144 corresponds to xi03. Inverter 146 corresponds to xi04. Inverter 148 corresponds to xi05.

As discussed above, the model of the transistor and the description of the circuit can be used with a simulator to model/simulate the behavior of the circuit. The model and simulator may be software running on a computer system. Prior to loading into a computer system, the software may reside as encoded information on a computer readable medium, such as a magnetic floppy disk, magnetic tape, compact disc read only memory (CD—ROM) or other suitable medium. Alternatively, one or more parts of the simulator and/or model may be implemented using dedicated hardware specifically designed to perform the steps described above.

Figure 12:
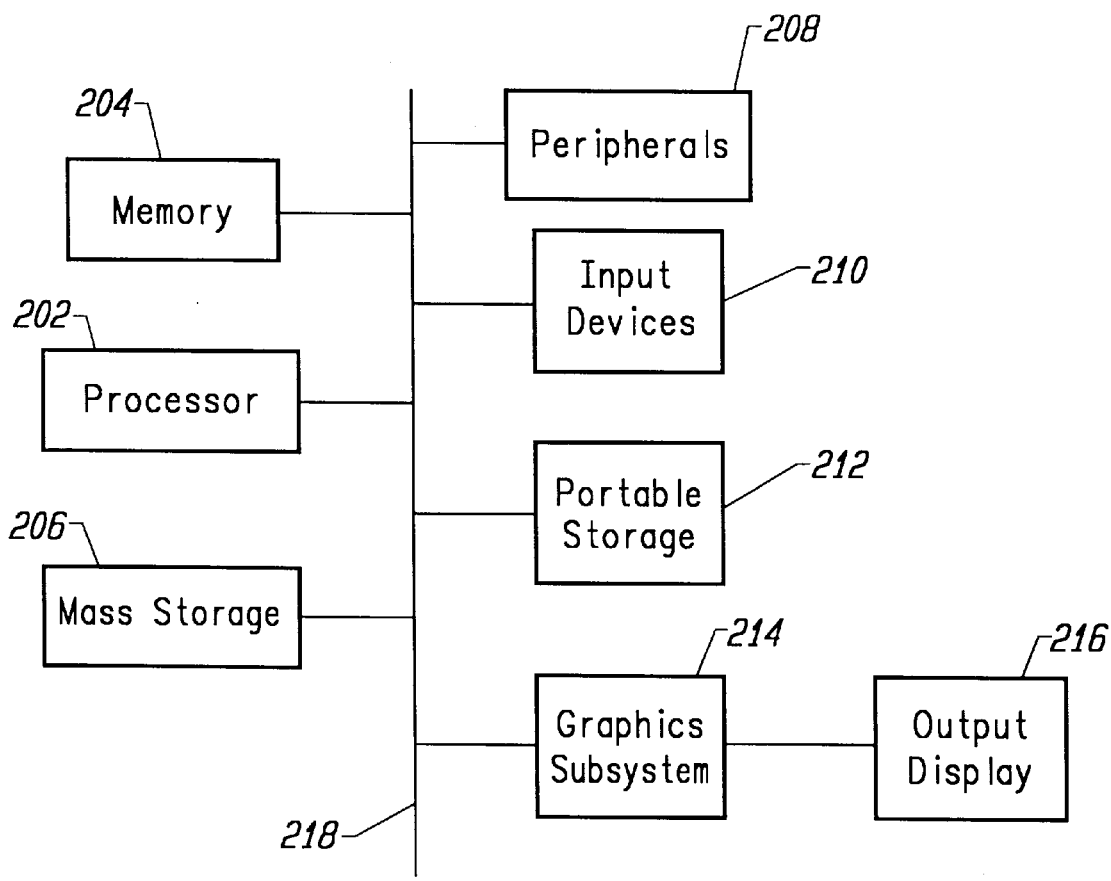
FIG. 12 is a block diagram of exemplar hardware for performing the steps depicted in FIG. 10.

FIG. 12 illustrates a high level block diagram of an exemplar general purpose computer system which can use the model described above to simulate a circuit. The computer system includes a processor unit 202 and main memory 204. Processor unit 202 may include a single microprocessor, or may contain a plurality of microprocessors. Main memory 204 stores, in part, instructions and data for execution by processor unit 202. For example, main memory 12 may store the above described model and all or part of the simulator during execution. Main memory 204 may include banks of dynamic random access memory (DRAM) as well as high speed cache memory.

The computer system also includes a mass storage device 206, peripheral device(s) 208, input device(s) 210, portable storage medium drive(s) 212, a graphics subsystem 214 and an output display 216. For purposes of simplicity, the components in the computer system are shown as being connected via a single bus 218. However, the computer system may be connected through one or more data transport means. For example, processor unit 202 and main memory 204 may be connected via a local microprocessor bus. Mass storage device 206, peripheral device(s) 208, portable storage medium drive(s) 212, graphics subsystem 214 may be connected via one or more input/output (I/O) busses. Mass storage device 206, which may be implemented with a magnetic disk drive or an optical disk drive, is a non-volatile storage device for storing data and instructions for use by processor unit 202. In one embodiment, mass storage device 206 stores the code for the model for purposes of loading to main memory 204.

Portable storage medium drive 212 operates in conjunction with a portable non-volatile storage medium, such as a floppy disk, to input and output data and code to and from the computer system. In one embodiment, the model of the transistor is stored on such a portable medium, and is input to the computer system via the portable storage medium drive 212. Peripheral device(s) 208 may include any type of computer support device, such as an input/output (I/O) interface, to add additional functionality to the computer system. For example, peripheral device(s) 208 may include a network interface card for interfacing the computer system to a network, a modem, etc.

Input device(s) 210 provide a portion of the user interface and may include an alpha-numeric keypad for inputting alpha-numeric and other key information, or a cursor control device, such as a mouse, a trackball, stylus, or cursor direction keys. In order to display textual and graphical information, the computer system contains graphics subsystem 214 and the output display 216. Output display 216 may include a cathode ray tube (CRT) display, liquid crystal display (LCD) or other suitable display device. Graphics subsystem 214 receives textual and graphical information, and processes the information for output to output display 216. Output display 216 can be used to report the results of a simulation in textual or graphical format. The components depicted in FIG. 12 are those typically found in general purpose computer systems, and are intended to represent a broad category of such computer components that are well known in the art. Numerous other systems can also suffice, such as Macintosh-based computers available from Apple Computer, Inc., systems with different bus configurations, networked systems, multi-processor systems, other personal computers, workstations, mainframes, and so on.

The foregoing detailed description of the invention has been presented for purposes of illustration and description. It is not intended to be exhaustive or to limit the invention to the precise form disclosed, and obviously many modifications and variations are possible in light of the above teaching. The described embodiment was chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A computer readable storage medium, comprising:
    a model of a transistor for use by a computer implemented circuit simulator, said transistor having a gate resistance, said model including:
        first code describing a gate, a source, and a drain; and
        second code describing a first resistance element having an amount of resistance equivalent to ⅓ of a gate resistance of said transistor, not including any capacitance that would induce an RC line delay, that approximates a gate resistance induced propagation delay (GRID) of said transistor, said GRID representing a delay induced by a total polygate resistance of said transistor, said first resistance element being connected to said gate;
    wherein said model is stored in a format readable by a set of computer instructions, that, when loaded into a computer cause the computer instructions to read said model and perform a circuit analysis including a transistor described by said model.

2. A computer readable storage medium according to claim 1, wherein:
    said transistor is a CMOS transistor.

3. A computer readable storage medium according to claim 1, wherein:
    said first resistance element is a resistor.

4. A computer readable storage medium according to claim 3, further comprising:
    a description of a circuit for use by said computer implemented circuit simulator, said circuit including said transistor.

5. A computer readable storage medium according to claim 3, further comprising:

a description of an inverter for use by said computer implemented circuit simulator, said inverter including said transistor.

6. A computer readable storage medium according to claim 3, further comprising:
a description of an NAND gate for use by said computer implemented circuit simulator, said NAND gate including said transistor.

7. A computer readable storage medium according to claim 1, wherein:
said model further includes:
third code describing a second resistance element having a resistance approximately equal to two thirds of said gate resistance, said second resistance element being connected to said gate.

8. A computer readable storage medium according to claim 7, wherein:
said first resistance element and said second resistance element are resistors.

9. The computer readable storage medium according to claim 1, wherein said first resistance element has a resistance value of one third said gate resistance.

10. A computer readable storage medium having code stored thereon, that, when loaded into a computer, are utilized by the computer to perform a circuit analysis, comprising:
first code, said first code simulates a circuit based on one or more circuit input files;
second code describing said circuit, said circuit including a transistor, said transistor having a gate resistance, said second code for use with said first code; and
third code describing a model of said transistor, said model including:
a device having a gate, source, and drain; and
a first resistance element having an amount of resistance equivalent to ⅓ of a gate resistance of said transistor, not including any capacitance that would induce an RC line delay, that approximates a gate resistance induced propagation delay (GRID) of said transistor, said GRID representing a delay induced by a total polygate resistance of said transistor, said first resistance element being connected to said gate.

11. A computer readable storage medium according to claim 10, wherein:
said transistor is a CMOS transistor.

12. A computer readable storage medium according to claim 10, wherein:
said first resistance element is a resistor.

13. A computer readable storage medium according to claim 12, wherein:
said circuit includes an inverter, said transistor being part of said inverter.

14. A computer readable storage medium according to claim 10, wherein:
said model further includes a second resistance element having a resistance approximately equal to two thirds of said gate resistance, said second resistance element being connected to said gate.

15. A computer readable storage medium according to claim 14, wherein:
said first resistance element and said second resistance element are resistors.

16. The computer readable storage medium according to claim 10, wherein said first resistance element has a resistance value of one third said gate resistance.

17. A method of creating a model of a transistor, comprising the steps of:
defining said transistor, said transistor including a gate, a source, and a drain, said transistor having a gate resistance;
describing a resistance element connected to said gate, said resistance element having an amount of resistance equivalent to ⅓ of said gate resistance, not including any capacitance that would induce an RC line delay, that approximates a gate resistance induced propagation delay (GRID) of said transistor, said GRID representing a delay induced by a total polygate resistance of said transistor; and
storing the defined transistor and described resistance in a model having a format readable by a set of computer instructions that when loaded into a computer cause the computer to read said model and perform a circuit analysis including a transistor described by said model.

18. A method according to claim 17, wherein:
said transistor is a CMOS transistor.

19. A method according to claim 17, wherein:
said resistance element is a first resistor.

20. A method according to claim 19, further comprising the step of:
describing a second resistor connected to said gate, said second resistor having a resistance approximately equal to two thirds of said gate resistance.

21. A method according to claim 19, further comprising the steps of:
determining said gate resistance for said transistor.

22. The method according to claim 17, wherein said resistance element has a resistance value of one third said gate resistance.

23. A method of simulating a circuit, comprising the steps of:
describing a circuit using computer readable code, said circuit including a transistor;
modeling said transistor using computer readable code, said transistor including a gate, a sources and a drain, said transistor having a gate resistance, said step of modeling includes modeling said gate resistance as a first resistance element connected to said gate, said first resistance element having a resistance equivalent to ⅓ of a gate resistance of said transistor, not including any capacitance that would induce an RC line delay, that approximates a gate resistance induced propagation delay (GRID) of said transistor, said GRID representing a delay induced by a total polygate resistance of said transistor; and
simulating said circuit, including monitoring said circuit's behavior during simulated operation of said circuit.

24. A method according to claim 23, wherein:
said first resistance element is a first resistor.

25. A method according to claim 24, further comprising the step of:
determining said gate resistance for said transistor.

26. The method according to claim 23, wherein said resistance element has a resistance value of one third said gate resistance.

27. An apparatus for simulating a circuit, said circuit including a transistor, said transistor including a gate, a drain, and a source, said transistor having a gate resistance, comprising:
a processor programmed to simulate said circuit based on an electronic description of said circuit;

a memory device in communication with said processor, said memory device stores said electronic description of said circuit, said electronic description of said circuit includes a model of said transistor, said model describes a first resistance element being connected to said gate, said first resistance element having a resistance equivalent to ⅓ of a gate resistance of said transistor, not including any capacitance that would induce an RC line delay, that approximates a gate resistance induced propagation delay (GRID) of said transistor, said GRID representing a delay induced by a total polygate resistance of said transistor.

28. An apparatus according to claim 27, further including:

an output device in communication with said processor, said output device reports results of a simulation.

29. An apparatus according to claim 27, wherein:

said transistor is a CMOS transistor.

30. An apparatus according to claim 27, wherein:

said first resistance element is a resistor.

31. An apparatus according to claim 27, wherein:

said model further describes a second resistance element being connected to said gate, said second resistance element having a resistance approximately equal to two thirds of said gate resistance.

32. The apparatus according to claim 27, wherein said first resistance element has a resistance value of one third said gate resistance.

33. An apparatus for modeling a circuit, said circuit including a transistor, said transistor including a gate, a drains and a source, said transistor having a gate resistance, comprising:

means for describing said circuit using computer readable code; and means for modeling said transistor using computer readable code including means for modeling said gate resistance as at least a first resistance element connected to said gate having a resistance equivalent to ⅓ of a gate resistance of said transistor, not including any capacitance that would induce an RC line delay, that approximates a gate resistance induced propagation delay (GRID) of said transistor, said GRID representing a delay induced by a total polygate resistance of said transistor.

34. An apparatus according to claim 33, wherein:

said first resistance element is a resistor.

35. The apparatus according to clam 33, wherein said first resistance element has a resistance value of one third said gate resistance.

36. An apparatus for modeling a circuit, said circuit including a transistor, said transistor including a gate, a drains and a source, said transistor having a gate resistance, comprising:

means for describing said circuit using computer readable code; and means for modeling said transistor using computer readable code including means for modeling said gate resistance as a first resistance element connected to said gate and a second resistance element connected to said gate, said first resistance element equivalent to ⅓ of a gate resistance of said transistor, not including any capacitance that would induce an RC line delay, and said second resistance element approximating a gate resistance induced propagation delay (GRID) of said transistor, said GRID representing a delay induced by a total polygate resistance of said transistor.

37. An apparatus according to claim 30, wherein:

said first resistance element and said second resistance element are resistors.

38. The apparatus according to claim 36, wherein:

said first resistance element has a value of ⅓ said gate resistance; and said second resistance element has a value of ⅔ said gate resistance.

39. An apparatus for simulating a circuit, said circuit including a transistor, said transistor including a gate, a drain, and a source, said transistor having a gate resistance, comprising:

means for describing said circuit using computer readable code;

means for modeling said transistor using computer readable code including means for modeling said gate resistance as at least a resistor connected to said gate, said resistor having a resistance equivalent to ⅓ of a gate resistance of said transistor, not including any capacitance that would induce an RC line delay, that approximates a gate resistance induced propagation delay (GRID) of said transistor, said GRID representing a delay induced by the total polygate resistance of said transistor means for simulating said circuit, including monitoring said circuit's behavior during simulated operation of said circuit.

40. The apparatus according to claim 32, wherein said resistor has a resistance value of ⅓ said gate resistance.

* * * * *